(12) United States Patent
Zhou et al.

(10) Patent No.: US 11,133,750 B2
(45) Date of Patent: Sep. 28, 2021

(54) POWER MODULE

(71) Applicant: Delta Electronics (Shanghai) Co., Ltd., Shanghai (CN)

(72) Inventors: Jinping Zhou, Shanghai (CN); Min Zhou, Shanghai (CN); Zhiheng Fu, Shanghai (CN); Pengkai Ji, Shanghai (CN); Shouyu Hong, Shanghai (CN); Yiqing Ye, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 57 days.

(21) Appl. No.: 16/695,196

(22) Filed: Nov. 26, 2019

(65) Prior Publication Data

US 2020/0169181 A1   May 28, 2020

Related U.S. Application Data

(63) Continuation-in-part of application No. 16/671,158, filed on Oct. 31, 2019, and a continuation-in-part of application No. 16/671,153, filed on Oct. 31, 2019.

(30) Foreign Application Priority Data

Nov. 2, 2018   (CN) .......................... 201811301174.6
Nov. 2, 2018   (CN) .......................... 201811301239.7

(Continued)

(51) Int. Cl.
  *H01F 17/04*   (2006.01)
  *H02M 7/00*   (2006.01)
(Continued)

(52) U.S. Cl.
  CPC ............ *H02M 7/003* (2013.01); *H01F 27/24* (2013.01); *H01F 27/28* (2013.01); *H01L 23/66* (2013.01);
(Continued)

(58) Field of Classification Search
  CPC .. H01F 27/28; H01F 27/2804; H01F 27/2847; H01F 27/40
(Continued)

(56) References Cited

U.S. PATENT DOCUMENTS 3,826,967 A   7/1974   Wilkinson et al.
4,253,231 A   3/1981   Nouet
(Continued)

FOREIGN PATENT DOCUMENTS

CN   1202265 A   12/1998
CN   101322201 A   12/2008
(Continued)

OTHER PUBLICATIONS

Khan Afia et al., "Design and Comparative Analysis of Litz and Copper Foil Transformers for High Frequency Applications," 2018 20th European Conference on Power Electronics and Applications (EPE'18 ECCE Europe), EPE Association, Sep. 17, 2018, 10 pages.
(Continued)

*Primary Examiner* — Shawki S Ismail
*Assistant Examiner* — Kazi S Hossain
(74) *Attorney, Agent, or Firm* — CKC & Partners Co., LLC

(57) ABSTRACT

The present disclosure provides a power module including a transformer, a first switching unit and a second switching unit; the transformer includes a magnetic core and a flatwise-wound winding wound around a winding pillar of the magnetic core; the flatwise-wound winding includes a first winding, a first end of the first winding and the first
(Continued)

switching unit are electrically connected and are located on the first side face of the winding pillar, projections of the first switching unit, the first end of the first winding, and the winding pillar on the first side face overlap each other; a second end of the first winding and the second switching unit are electrically connected and are located on the second side face of the winding pillar, projections of the second switching unit, the second end of the first winding, and the winding pillar on the second side face overlap each other.

20 Claims, 7 Drawing Sheets

(30) Foreign Application Priority Data

| Aug. 28, 2019 | (CN) | 201910801372.7 |
| Oct. 29, 2019 | (CN) | 201911035920.6 |
| Oct. 30, 2019 | (CN) | 201911042722.2 |

(51) Int. Cl.
  *H03H 1/00* (2006.01)
  *H01F 27/24* (2006.01)
  *H01L 23/66* (2006.01)
  *H01F 27/28* (2006.01)
  *H02M 7/219* (2006.01)

(52) U.S. Cl.
  CPC ... *H03H 1/0007* (2013.01); *H01L 2223/6666* (2013.01); *H02M 7/219* (2013.01); *H03H 2001/0014* (2013.01)

(58) Field of Classification Search
  USPC .................................. 336/221, 220, 120
  See application file for complete search history.

(56) References Cited

U.S. PATENT DOCUMENTS

| 4,777,465 | A | | 10/1988 | Meinel | |
| 5,631,822 | A | * | 5/1997 | Silberkleit | H01F 27/2804 336/200 |
| 5,877,666 | A | | 3/1999 | Johnson, Jr. et al. | |
| 6,040,753 | A | | 3/2000 | Ramakrishnan et al. | |
| 6,188,305 | B1 | | 2/2001 | Chang et al. | |
| 6,246,311 | B1 | | 6/2001 | Finnemore et al. | |
| 7,468,649 | B2 | * | 12/2008 | Chandrasekaran | H01F 27/38 323/358 |
| 8,295,066 | B2 | | 10/2012 | Lin | |
| 9,472,334 | B2 | | 10/2016 | Syvaranta et al. | |
| 2007/0139976 | A1 | | 6/2007 | deRochemont | |
| 2008/0239759 | A1 | * | 10/2008 | Nakahori | H01F 27/2804 363/20 |
| 2010/0164670 | A1 | * | 7/2010 | Nakahori | H05K 1/165 336/200 |
| 2010/0232181 | A1 | * | 9/2010 | Nakahori | H01F 27/2804 363/17 |
| 2016/0261179 | A1 | * | 9/2016 | Blanchard | H05K 1/165 |
| 2017/0222562 | A1 | * | 8/2017 | Nakahori | H02M 1/08 |
| 2017/0345756 | A1 | | 11/2017 | Yin et al. | |
| 2018/0175736 | A1 | | 6/2018 | Ishigaki | |

FOREIGN PATENT DOCUMENTS

| CN | 201348924 Y | 11/2009 |
| CN | 201478093 U | 5/2010 |
| CN | 101989490 A | 3/2011 |
| CN | 102460608 A | 5/2012 |
| CN | 202839237 U | 3/2013 |
| CN | 103943306 A | 7/2014 |
| CN | 204857409 U | 12/2015 |
| CN | 105261459 A | 1/2016 |
| CN | 105321677 A | 2/2016 |
| CN | 105590734 A | 5/2016 |
| CN | 105789031 A | 7/2016 |
| CN | 106030733 A | 10/2016 |
| CN | 206389608 U | 8/2017 |
| CN | 107171532 A | 9/2017 |
| CN | 107210123 A | 9/2017 |
| CN | 207082424 U | 3/2018 |
| CN | 108122664 A | 6/2018 |
| CN | 109003779 A | 12/2018 |
| DE | 3732249 A1 | 4/1989 |
| DE | 19725865 A1 | 1/1998 |
| DE | 19954682 C1 | 8/2001 |
| JP | S59186313 A | 10/1984 |
| JP | 2015228436 A | 12/2015 |
| TW | 490688 B | 6/2002 |
| TW | 201023216 A | 6/2010 |
| TW | 201440089 A | 10/2014 |

OTHER PUBLICATIONS

Corresponding extended European search report dated Feb. 13, 2020.
The corresponding China Office Action dated Oct. 20, 2020.
The corresponding China Office Action dated Nov. 4, 2020.
Corresponding European Office Action dated Mar. 19, 2021.
Corresponding China office action dated Apr. 6, 2021.
Corresponding extended European search report dated Apr. 24, 2020.
Corresponding China Notice of Allowance dated Apr. 19, 2021.
Corresponding China office action dated Jul. 26, 2021.

\* cited by examiner

POWER MODULE

CROSS-REFERENCE TO RELATED APPLICATION

This application is a continuation-in-part application of U.S. application Ser. No. 16/671,153, filed on Oct. 31, 2019 and U.S. application Ser. No. 16/671,158, filed on Oct. 31, 2019. This application claims priority to Chinese Patent Application No. 201910801372.7, filed on Aug. 28, 2019. The U.S. application Ser. No. 16/671,153 claims priority to Chinese patent application No. 201811301239.7, filed on Nov. 2, 2018, and priority to Chinese Patent Application No. 201911042722.2, filed on Oct. 30, 2019. The U.S. application Ser. No. 16/671,158 claims priority to Chinese Patent Application No. 201811301174.6 filed on Nov. 2, 2018 and priority to Chinese Patent Application No. 201911035920.6, filed on Oct. 29, 2019. The contents of the above identified applications are incorporated herein by reference in their entireties.

TECHNICAL FIELD

The present disclosure relates to the field of power electronics technologies, and in particular, to a power module.

BACKGROUND

As human's requirement for intelligent life increases, so does society's need for data processing. The average amount of energy used to process data worldwide is hundreds of billions or even trillions of degrees per year; and a large data center may cover tens of thousands of square meters. Therefore, high efficiency and high power density are key indicators for the healthy development of this industry. The key unit of the data center is the server, and the motherboard of the server is usually composed of data processing chips (including Central Processing Unit (CPU), chipset, memory, etc.) and their power supply and necessary peripheral components.

The increase in processing capacity per unit volume of the server means an increase in the number and integration of these processing chips, resulting in an increase in space consumption and power consumption. Therefore, the power supplies (because they are on the same motherboard as the data processing chip, they are also called motherboard power supplies) used to power these chips are expected to have higher efficiency, smaller size, and higher power density to support the energy-saving and covering area reduction requirements of the entire server and even the entire data center.

There are generally two kinds of transformers for power modules for low voltage and high current applications. The first is a transformer based on the edgewise-wound winding which refers to a winding whose winding face is perpendicular to the axial direction of the winding pillar. Typically, the winding of this type of transformer uses a multilayer printed circuit board (PCB), and then the PCB is provided with an opening, through which the magnetic core's magnetic column pass. Such an edgewise-wound winding often occupies a larger area, and has a problem of uneven current distribution inside and outside the winding. Another is a transformer based on the flatwise-wound winding which refers to a winding whose winding face is parallel to the axial direction of the winding pillar. The flatwise-wound winding generally has higher space utilization, and the size of the transformer may be smaller than that of a PCB transformer. However, in a flatwise-wound winding transformer, since the width of the copper foil of the winding is larger in most cases, how to achieve a low loss connection between the winding and other devices is a big challenge. In a power module with low-voltage, high-current, and high-frequency, there is usually only one turn of the secondary winding, and the proportion of the extra loss caused by the undesired connection between the winding and the device in the total loss of the module is increasing.

Therefore, how to develop a power module that may improve the above prior art is an urgent need.

SUMMARY

To solve the above technical problem, the present disclosure provides a power module. The power module provided by the disclosure includes: a transformer, a first switching unit and a second switching unit; the transformer includes a magnetic core and a flatwise-wound winding, and the flatwise-wound winding is wound around a winding pillar of the magnetic core; the flatwise-wound winding includes a first winding, where a first end of the first winding is electrically connected to a first end of the first switching unit, and a second end of the first winding is electrically connected to a first end of the second switching unit; where the first end of the first winding and the first switching unit are located on a first side face of the winding pillar, and from a direction perpendicular to the first side face, projections of the first switching unit, the first end of the first winding, and the winding pillar on the first side face overlap each other; the second end of the first winding and the second switching unit are located on a second side face of the winding pillar, and from a direction perpendicular to the second side face, projections of the second switching unit, the second end of the first winding, and the winding pillar on the second side face overlap each other.

BRIEF DESCRIPTION OF THE DRAWINGS

In order to more clearly illustrate the technical solutions of the present disclosure or in the prior art, a brief introduction to the drawings used for describing the embodiments or the prior art will be made below. Obviously, the drawings in the following description show some embodiments of the present disclosure, and those skilled in the art may still derive other drawings from these drawings without any creative effort.

DESCRIPTION OF EMBODIMENTS

The technical solutions in the embodiments of the present disclosure will be clearly and completely described below with reference to the drawings in the embodiments of the present disclosure. Apparently, the described embodiments are some but not all of the embodiments according to the present disclosure. All other embodiments obtained by a person of ordinary skill in the art based on the embodiments of the present disclosure without creative efforts fall within the protection scope of the present disclosure.

Figure 1:
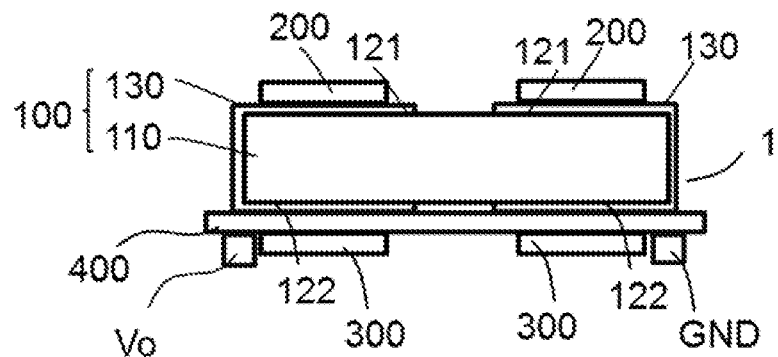
FIG. 1 is a schematic structural diagram of a power module according to Embodiment I of the present application.
Figure 2:
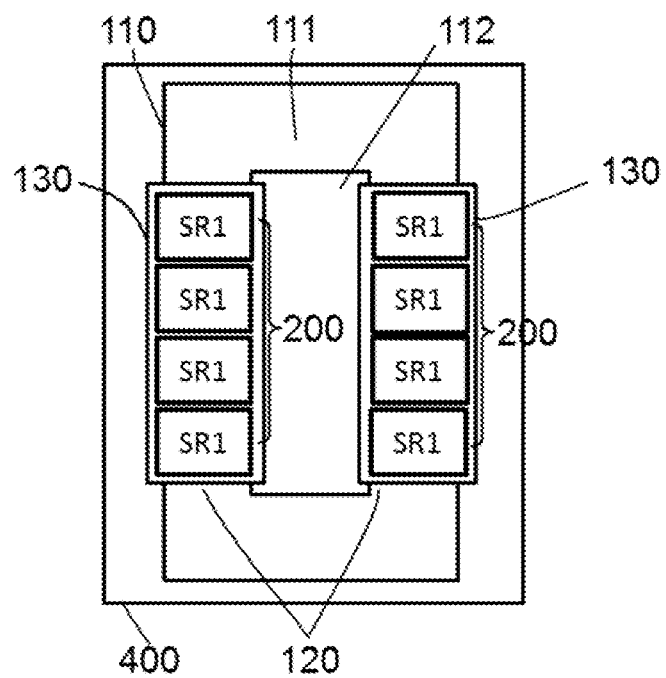
FIG. 2 is a top view of the power module shown in FIG. 1.
Figure 3:
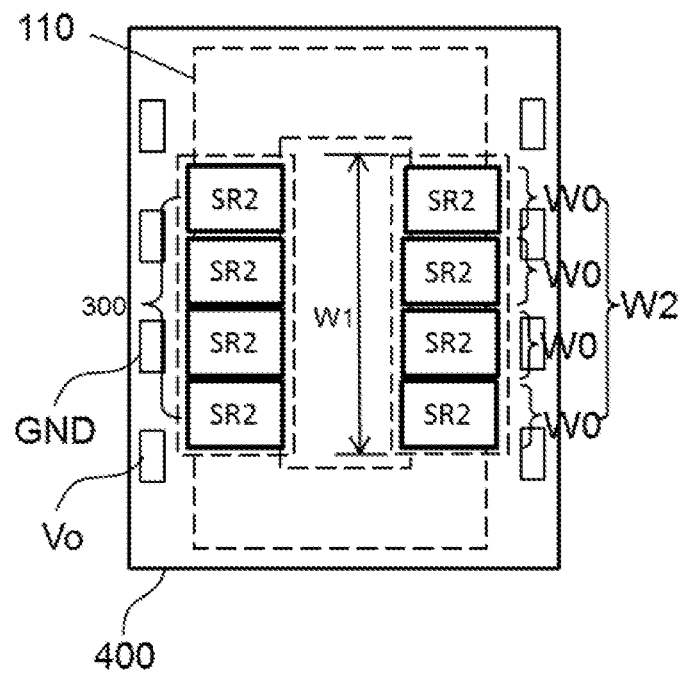
FIG. 3 is a bottom view of the power module shown in FIG. 1.
Figure 4:
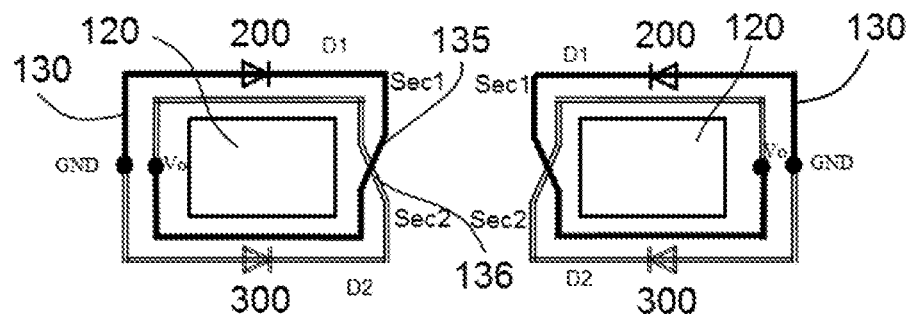
FIG. 4 is a cross-sectional view of the power module shown in FIG. 1.

FIG. 1 is a schematic structural diagram of a power module according to Embodiment I of the present disclosure, FIG. 2 is a top view of the power module shown in FIG. 1, FIG. 3 is a bottom view of the power module shown in FIG. 1, and FIG. 4 is a cross-sectional view of the power module shown in FIG. 1.

Referring to FIGS. 1 to 4, the power module 1 includes a transformer 100, a first switching unit 200, and a second switching unit 300. The transformer 100 includes a magnetic core 110 and a flatwise-wound winding 130 that is wound around a winding pillar 120 of the magnetic core 110. The flatwise-wound winding 130 includes a first winding, and the first end D1 of the first winding is electrically connected to the first end of the first switching unit 200, and the second end D2 of the first winding is electrically connected to the first end of the second switching unit 300. The first end D1 of the first winding and the first switching unit 200 are located on the first side face 121 of the winding pillar 120, and seen from the direction perpendicular to the first side face 121, projections of the first switching unit 200, the first end D1 of the first winding, and the winding pillar 120 on the first side face 121 overlap each other. The second end D2 of the first winding and the second switching unit 300 are located on the second side face 122 of the winding pillar 120, and seen from the direction perpendicular to the second side face 122, projections of the second switching unit 300, the second end D2 of the first winding, and the winding pillar 120 on the second side face 122 overlap each other.

In the power module 1, the first end of the first winding and the first switching unit are stacked directly above the first side face of the winding pillar, and the second end of the first winding and the second switching unit are stacked directly above the second side face of the winding pillar, which shortens the connection path between the winding and the switching unit, reduces the connecting loss, and improves the efficiency of the power module. In addition, the first side face and the second side face of the winding pillar are different sides, and the first switching unit and the second switching unit are disposed on different sides of the winding pillar, which reduces the footprint of the power module and improves heat dissipation effect.

In some alternative embodiments, as shown in FIG. 2, the magnetic core 110 further includes a connection part 111 that is connected to the winding pillar 120 to form a closed magnetic circuit. The winding pillar 120 of the magnetic core 110 may be I-shaped or C-shaped. The winding pillar 120 and the connection part 111 may form a rectangular-ambulatory-plane magnetic core 110, or may form an annular magnetic core 110. The shape of both the magnetic core 110 and the winding pillar 120 will not be limited in the present disclosure. The magnetic core 110 may include only one winding pillar 120 wound around by the flatwise-wound winding 130, or may include a plurality of winding pillars 120 wound around by the flatwise-wound windings 130, respectively. Exemplary, the magnetic core 110 in FIG. 2 includes two winding pillars 120, each of which is wound around by one flatwise-wound winding 130. The number of winding pillars will not be limited by the embodiment of the present disclosure. Additionally, the flatwise-wound windings 130 on the two winding pillars 120 may be connected in series or in parallel as required, or may be operated separately.

In some alternative embodiments, the flatwise-wound winding 130 may include a plurality of layers of conductor foil, and the conductor foil may be a copper foil or an aluminum foil. The material of the conductor foil will not be limited in the present disclosure. The flatwise-wound winding 130 and the winding pillar 120 are provided with an insulating layer therebetween, and the layers of conductor foil of the flatwise-wound windings 130 are also provided with an insulating layer therebetween. Exemplary, the material of the insulating layer may be ceramic.

In some alternative embodiments, the flatwise-wound winding 130 is plated on the magnetic core 110 by electroplating or electroless plating.

In some alternative embodiments, the flatwise-wound winding 130 is formed by cutting and bending the copper.

In some alternative embodiments, the first winding includes an outer conductor foil on the outermost side of the flatwise-wound winding 130, and the first winding may further include other layers of conductor foil. At least a part of the first winding is disposed at the outermost layer to facilitate electrical connection to the switching unit.

In some alternative embodiments, the first switching unit 200 includes a plurality of switching transistors SR1 connected in parallel, and the second switching unit 300 includes a plurality of switching transistors SR2 connected in parallel. Where the number of the switching transistors SR1 in the first switching unit 200 is the same as that of the switching transistors SR2 in the second switching unit 300. Exemplary, in the power module 1, the first switching unit 200 includes eight parallel switching transistors SR1, and the second switching unit 300 includes eight parallel switching transistors SR2. In other embodiments, the number of the switching transistors in the first switching unit and the number of the switching transistors in the second switching unit are not limited to eight, and may be set according to the actual current magnitude and the current withstanding capability of the single switching transistor. Exemplary, the number of the switching transistors in the first switching unit is one or more, and the number of the switching transistors in the second switching unit is one or more. Where the switching transistor may include a diode, a Metal-Oxide-Semiconductor Field-Effect Transistor (MOSFET), an Insulate-Gate Bipolar Transistor (IGBT) or other semiconductor devices.

In some alternative embodiments, when both the first switching unit and the second switching unit include a plurality of switching transistors, the first end D1 of the first windings includes a plurality of linearly arranged pads correspondingly, and second end D2 of the first winding also includes a plurality of linearly arranged pads, so as to make the first winding electrically connect with each of the switching transistors. Through the above pads, the first end D1 of the first winding and the switching transistor in the first switching unit may be electrically connected with low impedance, and the same is true between the second end D2 of the first winding and the switching transistor of the second switching unit.

In some alternative embodiments, the width of a single switching transistor in the first switching unit is smaller than that of the outer conductor foil, and the width of the single switching transistor in the second switching unit is smaller than that of the outer conductor foil. As shown in FIG. 3, the width W1 of the first winding may be similar to the width W2 of the switching unit, that is, the width W1 of the first winding is approximately 4 times the width W0 of the single switching transistor, thereby further achieving the current sharing of the windings.

In some alternative embodiments, as shown in FIG. 1 and FIG. 4, the first end D1 of the first winding is disposed on the upper side of the winding pillar 120, and the first switching unit 200 is stacked on the first end D1 of the first winding; the second end D2 of the first winding is disposed on the lower side of the winding pillar 120, and the second switching unit 300 is stacked directly below the second end D2 of the first winding. In other embodiments, the first switching unit 200 and the second switching unit 300 may be disposed not only on the upper side and the lower side of the winding pillar 120, as long as they are not disposed on the same side, which will not be limited in the disclosure. Since the first switching unit 200 and the second switching unit 300 are disposed on different sides of the winding pillar 120, the winding loss and the volume of the power module may be reduced when a plurality of switching transistors in parallel are used to achieve current sharing of winding current.

Figure 5:
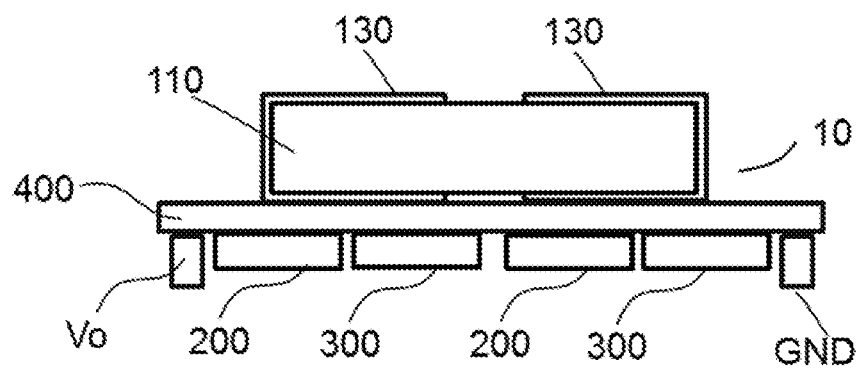
FIG. 5 is a schematic structural diagram of a power module.

FIG. 5 is a schematic structural diagram of a power module. As shown in FIG. 5, the power module 10 therein adopts a structure in which switching transistors are disposed on one side. As shown in FIG. 1, the power module 1 adopts a structure in which a switching transistors are disposed on two sides. The effect of the power module provided by the embodiment of the present disclosure in terms of loss reduction will be illustrated below by the comparison of power module 10 and power module 1.

The basic parameters of the power module 10 and the power module 1 are the same, and the parameters are as follows: the input voltage Vin=54V, the output voltage Vout=4.5V, the power Po=250 W, the switching frequency is 2 MHz, the primary side is a half bridge structure, and the ratio of winding of the transformer 100 is 6:1:1. The power module 10 and the power module 1 have the same footprint, the winding copper thickness t=70 um, and the winding width W2=13 mm. Table 1 is a loss feature comparison table of the power module 10 and the power module 1, which uses the finite element software to simulate the AC resistance of the winding and the connection of both the power module 10 and the power module 1. Where Rac_1st is the AC resistance measured on a primary side winding's Pri port at 2 MHz in case of shorting secondary side winding Sec, RDC is the DC resistance of the secondary side winding Sec, Rac_2nd is the AC resistance of the secondary side winding Sec at 4 MHz, and Pcu is the total loss of the winding and the connection with a half-load of 125 W.

TABLE 1

| Module | Resistance (mΩ) | | | |
| --- | --- | --- | --- | --- |
| | Rac_1st | RDC | Rac_2nd | Pcu |
| Power Module 10 | 18.8 | 0.94 | 2.32 | 0.93 |
| Power Module 1 | 14 | 0.53 | 1.36 | 0.63 (−32.2%) |

From Table 1, the winding loss and connecting loss of the power module 1 are reduced by about 32.2% compared to the power module 10 while ensuring the same footprint. In the power module 1, since the switching units are disposed on different sides of the winding pillar 120, the connection path between the winding and the switching unit is further shortened, thereby reducing the connecting loss of the winding.

At the same time, semiconductor switching transistors are often the main source of heat in the power module. In the power module 10, the first switching unit 200 and the second switching unit 300 are disposed on the same side of the winding pillar 120 of the transformer 100, and their heat may only be dissipated by one side. In the power module 1 provided in Embodiment I of the present disclosure, since the first switching unit 200 and the second switching unit 300 are respectively disposed on two sides of the winding pillar 120, the heat sources formed by the switching transistors are effectively dispersed on both sides, and their heat may be dissipated by two sides, thereby achieving higher power density.

Figure 6:
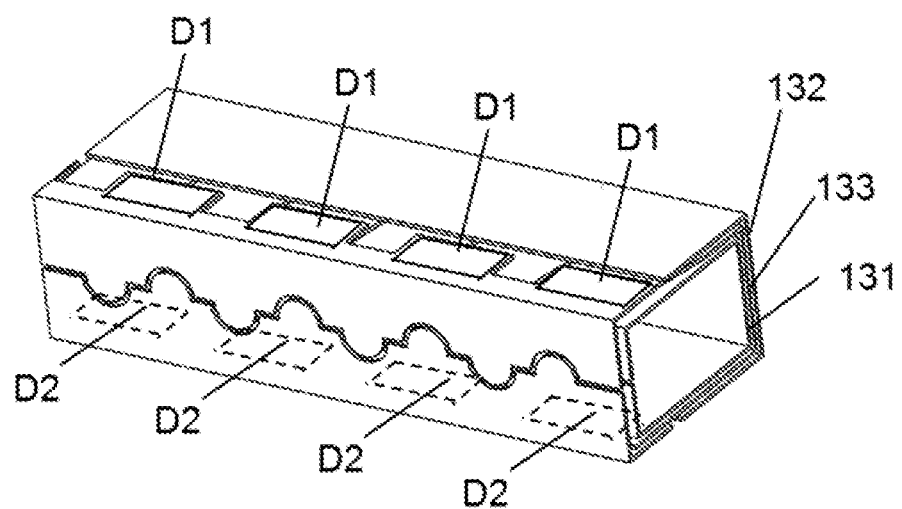
FIG. 6 is a schematic structural diagram of a flatwise-wound winding according to Embodiment I of the present application.
Figure 7:
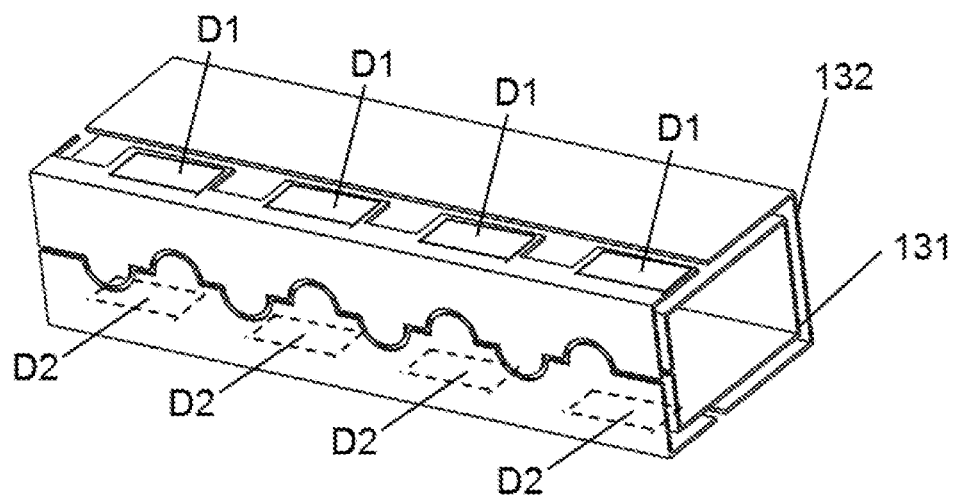
FIG. 7 is a schematic structural diagram of a first winding according to Embodiment I of the present disclosure.
Figure 8:
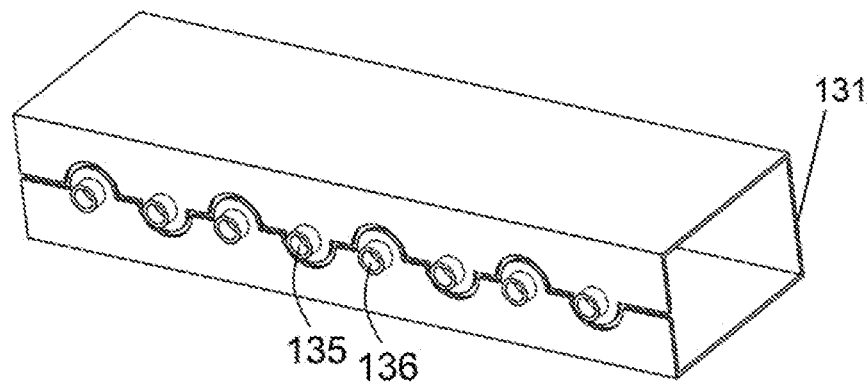
FIG. 8 is a schematic structural diagram of a first layer of conductor foil according to Embodiment I of the present disclosure.
Figure 9:
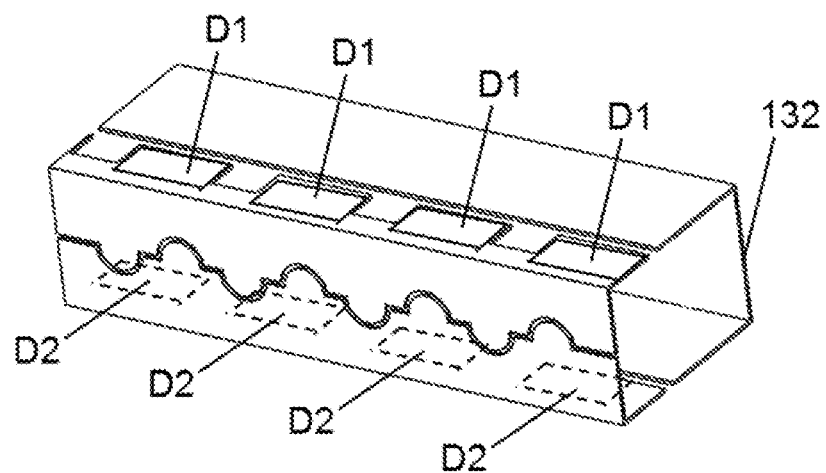
FIG. 9 is a schematic structural diagram of a second layer of conductor foil according to Embodiment I of the present disclosure.
Figure 10:
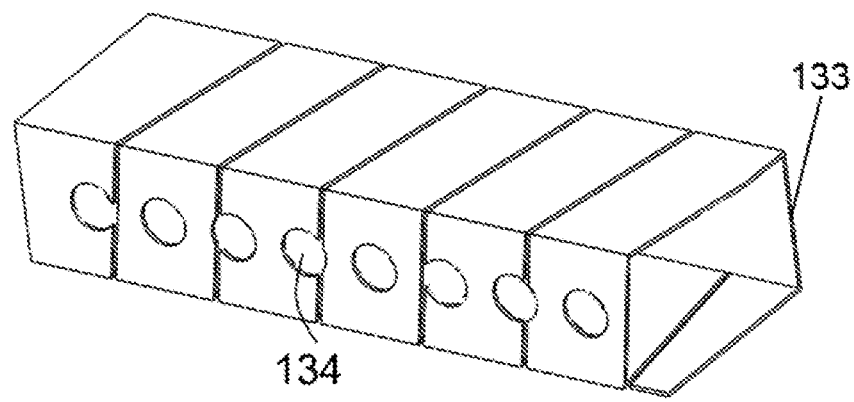
FIG. 10 is a schematic structural diagram of a third layer of conductor foil according to Embodiment I of the present disclosure.

FIG. 6 is a schematic structural diagram of a flatwise-wound winding according to Embodiment I of the present disclosure, FIG. 7 is a schematic structural diagram of a first winding according to Embodiment I of the present disclosure, and FIG. 8 is a schematic structural diagram of a first layer of conductor foil according to Embodiment I of the present disclosure, FIG. 9 is a schematic structural diagram of a second layer of conductor foil according to Embodiment I of the present disclosure, and FIG. 10 is a schematic structural diagram of a third layer of conductor foil according to Embodiment I of the present disclosure.

As shown in FIGS. 6 to 10, the flatwise-wound winding 130 may include three layers of conductor foil. FIG. 8 is a first layer of conductor foil 131, FIG. 9 is a second layer of conductor foil 132, and FIG. 10 is a third layer of conductor foil 133. Where the second layer of conductor foil 132 covers the first layer of conductor foil 131, and both the first layer of conductor foil 131 and the second layer of conductor foil 132 serve as the first winding of the transformer; the third layer of conductor foil 133 is located between the first layer of conductor foil 131 and the second layer of conductor foil 132, serving as the second winding of the transformer. It is worth noting that covering referred to herein represents at least partial covering, that is, it may represent a complete covering or a partial covering.

In some alternative embodiments, as shown in FIG. 4 and FIG. 7, the first winding includes a first sub-winding Sec1 and a second sub-winding Sec2, and the first sub-winding Sec1 includes a part of a first layer of conductor foil 131 and a part of a second layer of conductor foil 132 that are electrically connected by a first connecting post 135, and the second sub-winding Sec2 includes the other part of the first layer of conductor foil 131 and the other part of the second layer of conductor foil 132 that are electrically connected by a first connecting post 136. The black line in FIG. 4 represents the first sub-winding Sec1, and the double-dash line represents the second sub-winding Sec2. The first sub-winding Sec1 and the second sub-winding Sec2 of the first winding are wound around the same winding pillar 120 and overlap each other, so that the leakage inductance between the first sub-winding and the second sub-winding is small, which is favorable for reducing the loss of the rectifier device, further improves the efficiency of the power module. In other embodiments, the first sub-winding Sec1 may be formed by the first layer of conductor foil, and the second sub-winding Sec2 may be formed by the second layer of conductor foil. In other embodiments, the first winding may be formed by a combination of multiple layers of conductor foil or a layer of conductor foil. The number of layers of conductor foil included in the first winding will not be limited in present disclosure.

In some alternative embodiments, the first winding includes an outer conductor foil disposed on an outermost layer of the winding pillar 120, and the first end D1 of the first winding and the second end D2 of the first winding are both lead out from the outer conductor foil. As shown in FIG. 6, the first end D1 of the first winding and the second end D2 of the first winding are both located on the second layer of conductor foil 132, which facilitates the connection between the switching transistor and the winding, shortens the connecting line, and reduces the connecting loss.

In some alternative embodiments, the third layer of conductor foil 133 is provided with an access opening 134 through which both the first connecting post and the second connecting post pass, and the number of turns of the second winding is 6. In other embodiments, the second winding may be disposed on the inner side or the outer side of the first winding, or on other winding pillars; and the number of turns of the second winding may also be other values. The position and the number of turns of the second winding will not be limited in the present disclosure.

Figure 11:
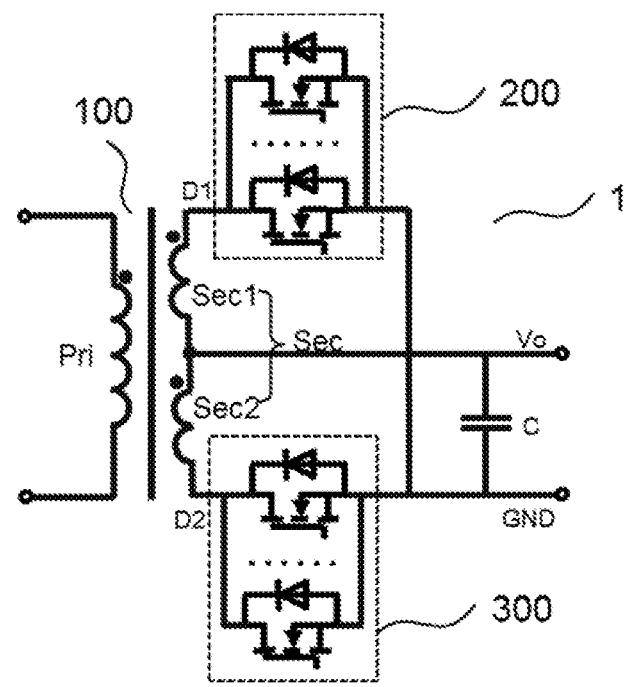
FIG. 11 is a schematic circuit diagram of a power module according to Embodiment I of the present disclosure.

FIG. 11 is a schematic circuit diagram of a power module according to Embodiment I of the present disclosure. As shown in FIG. 11, the power module 1 includes a transformer 100, a first switching unit 200, and a second switching unit 300. The transformer 100 includes a first winding and a second winding, the first winding serves as a secondary side winding Sec of the transformer 100, and the second winding serves as a primary side winding Pri of the transformer 100. The first end D1 of the first winding is electrically connected to the first switching unit 200, and the second end D2 of the first winding is electrically connected to the second switching unit 300. In other embodiments, the first winding may also be a primary side winding of the transformer, the second winding may be a secondary side winding of the transformer, and the switching unit forms a switching circuit on the primary side.

In some alternative embodiments, the power module 1 further includes a filter capacitor C, a power terminal Vo, and a ground terminal GND. The first end of the filter capacitor C is electrically connected to the power terminal Vo, and the second end of the filter capacitor C is electrically connected to the ground terminal GND.

In some alternative embodiments, the first winding includes a first sub-winding Sec1 and a second sub-winding Sec2. The connection point for connecting the first sub-winding Sec1 and the second sub-winding Sec2 in series is electrically connected to the power terminal Vo, and the second end of the first switching unit 200 and the second end of the second switching unit 300 are electrically connected to the ground terminal GND.

In some alternative embodiments, as shown in FIG. 1, the power module 1 further includes a carrier 400 with the power terminal Vo, the ground terminal GND, and the filter capacitor C of the power module 1 disposed thereon. In other embodiments, the signal terminal of the power module may also be disposed on the carrier 400.

In some alternative embodiments, the filter capacitors C may also be disposed on different sides of the core's winding pillar, similar to the arrangement of the first switching unit and the second switching unit. Specifically, the filter capacitors includes multiple capacitors in parallel. In this case, a part of the filter capacitors may be disposed on the first side face of the winding pillar, for example, on the plane where the first switching unit is located; the other part of the filter capacitors is disposed on the second side face of the winding pillar, for example, on a plane where the second switching unit is located. Such arrangement makes the output loop composed of the filter capacitors, the switching unit and the transformer winding more compact and makes the connecting loss less. Further, a part of the filter capacitors may be stacked on the first switching unit, and the other part of the filter capacitors may be stacked on the second switching unit.

In some alternative embodiments, as shown in FIG. 1, the first side face 121 is parallel to the second side face 122, and the first side face 121 and the second side face 122 are both located outside the winding window of the magnetic core 110. Specifically, the first switching unit 200 in the power module 1 is located on the upper side of the winding pillar 120, and the first switching unit 200 is directly soldered to the first end D1 of the first winding. The second switching unit 300 is located on the lower side of the winding pillar 120, the second switching unit 300 is soldered to the lower surface of the carrier 400, such as printed circuit board, and the transformer 100 is located on the upper surface of the carrier 400. The second switching unit 300 is electrically connected to the second end D2 of the first winding through the conductive wiring layer of the carrier 400, where the conductive wiring layer may include a via hole, a pad, etc.

Figure 12:
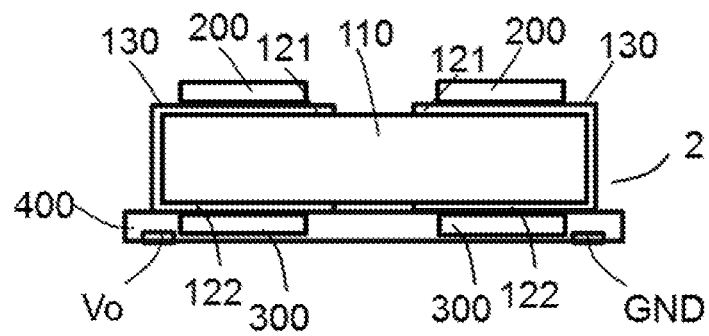
FIG. 12 is a schematic structural diagram of a power module according to Embodiment II of the present disclosure.

FIG. 12 is a schematic structural diagram of a power module according to Embodiment II of the present disclosure. As shown in FIG. 12, the power module 2 in this embodiment is similar in structure to the power module 1 in Embodiment I. The main difference is that in the power module 2, the second switching unit 300 is buried in the carrier 400, and the transformer 100 is located on the upper surface of the carrier 400; the second switching unit 300 is electrically connected to the second end D2 of the first winding through the conductive wiring layer of the carrier 400, where the conductive wiring layer may include a via hole, a pad, etc. The second switching unit 300 is electrically connected to the winding end of the transformer 100 through the carrier 400, so that the height of one layer of the carrier 400 may be saved for the power module, and the height of the power module may be further reduced.

Figure 13:
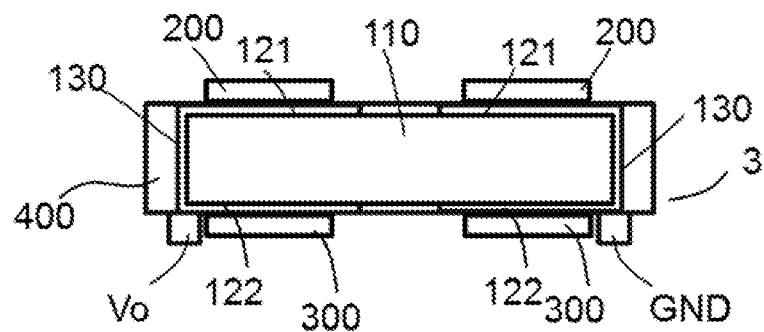
FIG. 13 is a schematic structural diagram of a power module according to Embodiment III of the present disclosure.

FIG. 13 is a schematic structural diagram of a power module according to Embodiment III of the present disclosure. As shown in FIG. 13, the power module 3 in this embodiment is similar in structure to the power module 1 in Embodiment I. The main difference is that in the power module 3, the transformer 100 is buried in the carrier 400, the first switching unit is located on the upper surface of the carrier 400, and the second switching unit is located on the lower surface of the carrier 400. In a practical application, there may be two implementation forms: in the first implementation form, the transformer 100 is manufactured first, including the core and the winding, and then the transformer is buried in the carrier 400; in the second implementation form, the core is buried into the carrier 400 first, and then the winding of the transformer 100 is manufactured based on the carrier. Either way, the first ends D1 of the first winding are all led out to the upper surface of the carrier 400, and the second ends D2 of the first winding are all led out to the lower surface of the carrier 400, finally. The first switching unit 200 is directly soldered to the first end D1 of the first winding located on the upper surface of the carrier 400, and the second switching unit 300 is directly soldered to the second end D2 of the first winding located on the lower surface of the carrier 400.

In some alternative embodiments, the transformer 100 is completely buried in the carrier 400, the first end D1 of the first winding is led out to the upper surface of the carrier 400 through the conductive wiring layer, and the second end D2 of the first winding is led out to the lower surface of the carrier 400 through the conductive wiring layer; the first switching unit 200 is electrically connected to the first end D1 of the first winding through the conductive wiring layer of the carrier 400, and the second switching unit 300 is electrically connected to the second end D2 of the first winding through the conductive wiring layer of the carrier 400. Where the conductive wiring layer may include a via hole, a pad, etc. Since the transformer 100 is buried in the carrier 400, the height of one layer of the carrier 400 may be saved for the power module, and the height of the power module may be further reduced.

Figure 14:
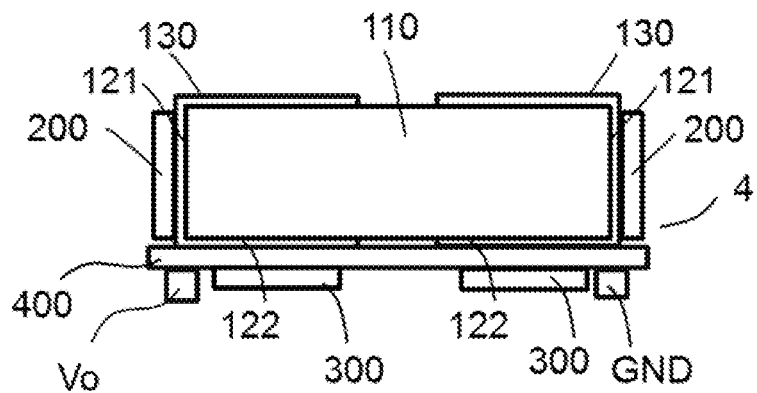
FIG. 14 is a schematic structural diagram of a power module according to Embodiment IV of the present disclosure.

FIG. 14 is a schematic structural diagram of a power module according to Embodiment IV of the present disclosure. As shown in FIG. 14, the power module 4 in this embodiment is similar in structure to the power module 1 in Embodiment I, and the main difference is that the position of the first end D1 of the first winding and the first switching unit 200 in the power module 4 is different with that in the power module 1. In the power module 4, the first end D1 of the first winding and the first switching unit 200 are located on the first side face 121 of the winding pillar 120, and the second end D2 of the first winding and the second switching unit 300 are both located on the second side face 122 of the winding pillar 120. The first side face 121 is perpendicular to the second side face 122, and the first side face 121 and the second side face 122 are both located outside the winding window of the magnetic core 110. It is worth noting that the switching unit is disposed outside the winding window, which facilitates to install and fix, and is favorable for heat dissipation. However, in other embodiments, the switching unit may also be located inside the winding window, which saves more space and reduces the volume of the power module.

Specifically, in the perspective of FIG. 14, the first switching unit 200 is located on the left side of the left winding pillar and on the right side of the right winding pillar, and the second switching unit 300 is located on the lower side of the winding pillar. That is, two switching units are respectively disposed on two adjacent sides. The first switching unit 200 may be directly soldered to the first end D1 of the first winding. The second switching unit 300 is soldered to the lower surface of the carrier 400, and the transformer 100 is located on the upper surface of the carrier 400; the second switching unit 300 is electrically connected to the second end D2 of the first winding through the conductive wiring layer of the carrier 400, where the conductive wiring layer may include a via hole, a pad, etc. The power module 4 has a lower height compared with the power module 1.

Figure 15:
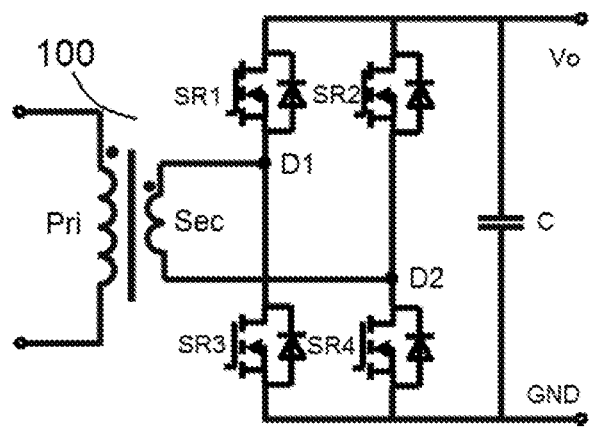
FIG. 15 is a schematic circuit diagram of a power module according to Embodiment V of the present disclosure.
Figure 16:
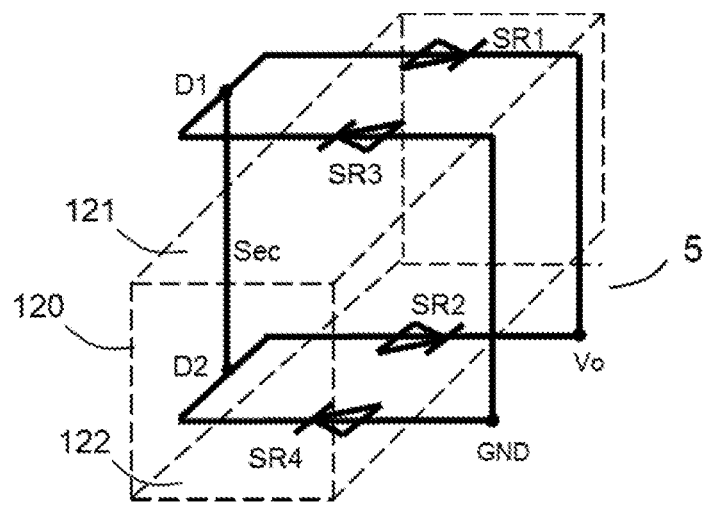
FIG. 16 is a schematic structural diagram of a power module according to Embodiment V of the present disclosure.

FIG. 15 is a schematic circuit diagram of a power module according to Embodiment V of the present disclosure, and FIG. 16 is a schematic structural diagram of a power module according to Embodiment V of the present disclosure. In the power module 5 of this embodiment, the secondary side rectification mode of the transformer 100 is full bridge rectification.

As shown in FIGS. 15 and 16, the first winding of the transformer 100 refers to the secondary winding Sec, and the second winding refers to the primary winding Pri. The first switching unit includes a first switching transistor SR1 and a third switching transistor SR3, and the second switching unit includes a second switching transistor SR2 and a fourth switching transistor SR4. The first end D1 of the secondary side winding Sec is electrically connected to the first end of the first switching unit, that is, electrically connected to both the second end of the first switching transistor SR1 and the first end of the third switching transistor SR3; the second end D2 of the secondary side winding Sec is electrically connected to the first end of the second switching unit, that is, electrically connected to both the second end of the second switching transistor SR2 and the first end of the fourth switching transistor SR4. The first end of the first switching transistor SR1 and the first end of the second switching transistor SR2 are electrically connected to the power terminal Vo, and both the second end of the third switching transistor SR3 and the second end of the fourth switching transistor SR4 are electrically connected to the ground terminal GND. The first switching transistor SR1 and the third switching transistor SR3 are disposed on the first side face 121 of the winding pillar 120, and the second switching transistor SR2 and the fourth switching transistor SR4 are disposed on the second side face 122 of the winding pillar 120. The first side face 121 and the second side face 122 are respectively the upper surface and the lower surface that are parallel to each other.

Figure 17:
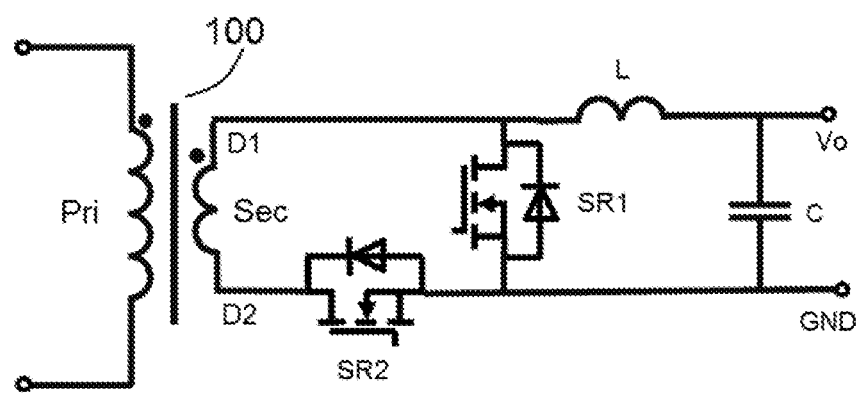
FIG. 17 is a schematic circuit diagram of a power module according to Embodiment VI of the present disclosure.
Figure 18:
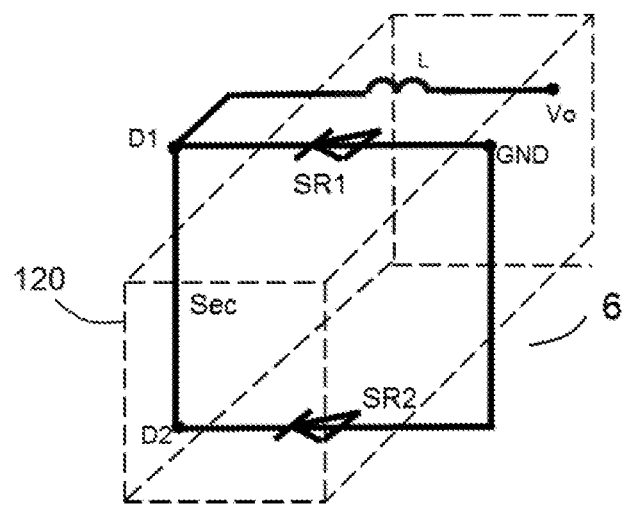
FIG. 18 is a schematic structural diagram of a power module device according to Embodiment VI of the present disclosure.

FIG. 17 is a schematic circuit diagram of a power module according to Embodiment VI of the present disclosure, and FIG. 18 is a schematic structural diagram of a power module according to Embodiment VI of the present disclosure. In this embodiment, the power module 6 includes a forward converter.

As shown in FIGS. 17 and 18, the first winding of the transformer 100 refers to the secondary winding Sec, and the second winding refers to the primary winding Pri. The power module 6 further includes a rectifying inductor L, the first switching unit includes a first switching transistor SR1, and the second switching unit includes a second switching transistor SR2. The first end D1 of the secondary winding Sec is electrically connected to the first end of the first switching unit, that is, electrically connected to both the first end of the first switching transistor SR1 and the first end of the rectifying inductor L; the second end D2 of the secondary winding Sec is electrically connected to the first end of the second switching unit, that is, electrically connected to the first end of the second switching transistor SR2. The second end of the rectifying inductor L is electrically connected to the power terminal Vo, and the second end of the first switching transistor SR1 and the second end of the second switching transistor SR2 are electrically connected to the ground terminal GND. The first switching transistor SR1 is disposed on the first side face 121 of the winding pillar 120, and the second switching transistor SR2 is disposed on the second side face 122 of the winding pillar 120. The first side face 121 and the second side face 122 are respectively the upper surface and lower surface that are parallel to each other. In other embodiments, the switching unit in the power module may also form other circuits.

In summary, the power module provided by the present disclosure, the first end of the first winding and the first switching unit are located on the first side face of the winding pillar, and seen from the direction perpendicular to the first side face, projections of the first switching unit, the first end D1 of the first winding, and the winding pillar on the first side face overlap each other; the second end of the first winding and the second switching unit are located on the second side face of the winding pillar, and seen from the direction perpendicular to the second side face, projections of the second switching unit, the second end of the first winding, and the winding pillar on the second side face overlap each other. The first end of the first winding and the first switching unit are stacked directly above the first side face of the winding pillar, and the second end of the first winding and the second switching unit are stacked directly above the second side face of the winding pillar, which shortens the connection path between the winding and the switching unit, reduces the connecting loss, and improves the efficiency of the power module.

Finally, it should be noted that the above embodiments are merely illustrative of the technical solutions of the present disclosure, and are not to be taken in a limiting sense; although the present disclosure has been described in detail with reference to the above embodiments, those skilled in the art will understand that they may still modify the technical solutions described in the above embodiments, or equivalently substitute some or all of the technical features; and the modifications or substitutions do not deviate the nature of the corresponding technical solutions from the range of the technical solutions of the embodiments of the present disclosure.

What is claimed is:

1. A power module, wherein the power module comprises a transformer, a first switching unit and a second switching unit;
    the transformer comprises a magnetic core and a flatwise-wound winding, and the flatwise-wound winding is wound around a winding pillar of the magnetic core;
    the flatwise-wound winding comprises a first winding, wherein a first end of the first winding is electrically connected to a first end of the first switching unit, and a second end of the first winding is electrically connected to a first end of the second switching unit;
    wherein the first end of the first winding and the first switching unit are located on a first side face of the winding pillar, and from a direction perpendicular to the first side face, projections of the first switching unit, the first end of the first winding, and the winding pillar on the first side face overlap each other;
    the second end of the first winding and the second switching unit are located on a second side face of the winding pillar, and from a direction perpendicular to the second side face, projections of the second switching unit, the second end of the first winding, and the winding pillar on the second side face overlap each other.

2. The power module of claim 1, wherein the first side face is parallel to the second side face, and the first side face and the second side face are both located outside of a winding window of the magnetic core.

3. The power module of claim 1, wherein the first side face is perpendicular to the second side face, and the first side face and the second side face are both located outside a winding window of the magnetic core.

4. The power module of claim 1, wherein the power module further comprises a filter capacitor, a power terminal, and a ground terminal;
    a first end of the filter capacitor is electrically connected to the power terminal, and a second end of the filter capacitor is electrically connected to the ground terminal.

5. The power module of claim 4, wherein the first winding comprises a first sub-winding and a second sub-winding;
    a connection point for connecting the first sub-winding and the second sub-winding in series is electrically connected to the power terminal;
    a second end of the first switching unit and a second end of the second switching unit are electrically connected to the ground terminal.

6. The power module of claim 5, wherein the first sub-winding comprises a part of a first layer of conductor foil and a part of a second layer of conductor foil that are electrically connected by a first connecting post, and the second sub-winding comprises the other part of the first layer of conductor foil and the other part of the second layer of conductor foil that are electrically connected by a second connecting post;
    wherein the second layer of conductor foil covers the first layer of conductor foil, and the first end of the first winding and the second end of the first winding are both located on the second layer of conductor foil.

7. The power module of claim 6, wherein the flatwise-wound winding further comprises a second winding which comprises a third layer of conductor foil;
    the third layer of conductor foil is located between the first layer of conductor foil and the second layer of conductor foil, and the third layer of conductor foil is provided with an access opening through which both the first connecting post and the second connecting post pass.

8. The power module of claim 1, further comprising a carrier, wherein the power terminal and the ground terminal of the power module are both disposed on the carrier.

9. The power module of claim 8, wherein the second switching unit is located on a lower surface of the carrier, and the transformer is located on an upper surface of the carrier;
    the second switching unit is electrically connected to the second end of the first winding through a conductive wiring layer of the carrier.

10. The power module of claim 8, wherein the second switching unit is buried in the carrier, and the transformer is located on an upper surface of the carrier;
    the second switching unit is electrically connected to the second end of the first winding through a conductive wiring layer of the carrier.

11. The power module of claim 8, wherein the transformer is buried in the carrier, the first switching unit is located on an upper surface of the carrier, and the second switching unit is located on a lower surface of the carrier;

wherein the first switching unit is soldered to the first end of the first winding on the upper surface of the carrier, or is electrically connected to the first end of the first winding through a conductive wiring layer of the carrier;

the second switching unit is soldered to the second end of the first winding on the lower surface of the carrier, or is electrically connected to the second end of the first winding through the conductive wiring layer of the carrier.

12. The power module of claim 1, wherein the first end of the first winding comprises a plurality of linearly arranged pads, and the second end of the first winding comprises a plurality of linearly arranged pads.

13. The power module of claim 1, wherein the flatwise-wound winding is plated on the magnetic core by electroplating or electroless plating;

the flatwise-wound winding and the winding pillar are provided with an insulating layer therebetween, and the layers of the conductor foil in the flatwise-wound winding are also provided with an insulating layer therebetween.

14. The power module of claim 1, wherein the magnetic core further comprises a connection part that is connected to the winding pillar to form a closed magnetic circuit.

15. The power module of claim 1, wherein the first switching unit comprises a plurality of switching transistors being connected in parallel, and the second switching unit comprises a plurality of switching transistors being connected in parallel.

16. The power module of claim 15, wherein the first winding comprises an outer conductor foil disposed on an outermost layer of the winding pillar, and both the first end of the first winding and the second end of the first winding are lead out from the outer conductor foil;

the width of a single switching transistor in the first switching unit is smaller than that of the outer conductor foil, and the width of a single switching transistor in the second switching unit is smaller than that of the outer conductor foil.

17. The power module of claim 4, wherein among filter capacitors of the power module, a part of the filter capacitors is disposed on the first side face, and the other part of the filter capacitors is disposed on the second side face.

18. The power module of claim 4, wherein among filter capacitors of the power module, a part of the filter capacitors is stacked on the first switching unit, and the other part of the filter capacitors is stacked on the second switching unit.

19. The power module of claim 4, wherein the first switching unit comprises a first switching transistor and a third switching transistor, and the second switching unit comprises a second switching transistor and a fourth switching transistor;

the first end of the first winding is electrically connected to both a second end of the first switching transistor and a first end of the third switching transistor, and the second end of the first winding is electrically connected to both a second end of the second switching transistor and a first end of the fourth switching transistor;

a first end of the first switching transistor and a first end of the second switching transistor are electrically connected to the power terminal, and a second end of the third switching transistor and a second end of the fourth switching transistor are electrically connected to the ground terminal.

20. The power module of claim 4, wherein the power module further comprises a rectifying inductor, the first switching unit comprises a first switching transistor, and the second switching unit comprises a second switching transistor;

the first end of the first winding is electrically connected to both a first end of the first switching transistor and a first end of the rectifying inductor, and the second end of the first winding is electrically connected to a first end of the second switching transistor;

a second end of the rectifying inductor is electrically connected to the power terminal, and a second end of the first switching transistor and a second end of the second switching transistor are electrically connected to the ground terminal.

* * * * *